United States Patent [19]
Nakajima et al.

[11] Patent Number: 5,880,024
[45] Date of Patent: Mar. 9, 1999

[54] SEMICONDUCTOR DEVICE HAVING WIRING SELF-ALIGNED WITH SHIELD STRUCTURE AND PROCESS OF FABRICATION THEREOF

[75] Inventors: Tsutomu Nakajima; Yoshihiro Hayashi, both of Tokyo, Japan

[73] Assignee: NEC Corporation, Tokyo, Japan

[21] Appl. No.: 570,241

[22] Filed: Dec. 11, 1995

[30] Foreign Application Priority Data

Dec. 26, 1994 [JP] Japan ................................ 6-322535

[51] Int. Cl.$^6$ ................................ H01L 21/461
[52] U.S. Cl. .................. 438/669; 438/633; 438/622
[58] Field of Search .................. 437/195, 41 SM, 437/228, 235, 245; 438/622, 633, 666, 669, 631

[56] References Cited

U.S. PATENT DOCUMENTS

| | | | |
|---|---|---|---|
| 5,094,965 | 3/1992 | Ozaki et al. ................... | 437/40 |
| 5,111,257 | 5/1992 | Andok et al. . | |
| 5,262,353 | 11/1993 | Sun et al. ..................... | 437/195 |
| 5,328,553 | 7/1994 | Poon ............................ | 156/636 |
| 5,510,638 | 4/1996 | Lancaster et al. ............ | 257/314 |

FOREIGN PATENT DOCUMENTS 2-82531  3/1990  Japan .

OTHER PUBLICATIONS

"Closely Packed Microstrip Lines as Very High–Speed Chip–to–Chip Interconnects", Oh–Kyong Kwon et al, IEEE Transactions on Components, Hybrids. and Manufacturing Technology, vol. CHMT–10, No. 3, pp. 314 to 320, Sep. 1987.

"The Parylene–Aluminum Multilayer Interconnection System for Wafer Scale Integration and Wafer Scale Hybrid Package", Journal of Electronic Materials, vol. 18, No. 2, pp. 301 to 311, 1989.

"VLSI Multilevel Micro–Coaxial Interconnects for High Speed Devices" by IEDM 90.

Primary Examiner—Caridad Everhart
Attorney, Agent, or Firm—Laff, Whitesel, Conte & Saret, Ltd.

[57] ABSTRACT

A semiconductor integrated circuit device has circuit components, a wiring arrangement electrically connected to the circuit components and a shield structure for preventing signal wirings from a cross-talk between the signal wirings, and the signal wirings are patterned from a conductive layer extending over grooves formed in the shield structure so as to be self-aligned with the shield structure.

5 Claims, 6 Drawing Sheets

ID=5,880,024

SEMICONDUCTOR DEVICE HAVING WIRING SELF-ALIGNED WITH SHIELD STRUCTURE AND PROCESS OF FABRICATION THEREOF

FIELD OF THE INVENTION

This invention relates to a semiconductor device and, more particularly, to a semiconductor device having a wiring self-aligned with a shield structure and a process of fabrication thereof.

DESCRIPTION OF THE RELATED ART

A semiconductor integrated circuit device fabricated on a silicon substrate has been multifunctionized and increased in integration density. The large number of circuit components are selectively connected through wirings, and the multi-functional integrated circuit complicates the wiring arrangement. In order to fabricate the complicated wiring arrangement without the semiconductor substrate, the wirings are decreased in width and pitch, and are three-dimensionally arranged over the semiconductor substrate. The narrow wirings propagate signals to the circuit components, and the integrated circuit achieves a given task. If the integrated circuit is expected to dynamically achieve the given task in response to a clock signal, the wiring arrangement distributes the clock signal, and the clock frequency is sometimes higher than 500 MHz.

However, the high-density wiring arrangement encounters a problem in a cross-talk noise between adjacent wirings. When a circuitry raises or decays a signal on a wiring, a noise is generated on the adjacent wiring through the electrostatic induction, and the adjacent wiring propagates the noise to another circuitry as if a true signal is supplied thereto. Thus, the cross-talk noise behaves as the true signal, and is causative of a malfunction.

One of the protections against the cross-talk noise is disclosed by Kwon et. al. in "Closely Packed Microstrip Lines as Very High-Speed Chip-to-Chip Interconnects", IEEE Transactions on Components, Hybrids. and Manufacturing Technology, vol. CHMT-10, No. 3, pages 314 to 320, September 1987. Kwon et. al. proposes to insert a shield layer 1 between upper wirings 2 and lower wirings 3 as shown in FIG. 1. FIG. 1 is corresponding to FIG. 1 of Kwon's paper. A silicon substrate 4 is overlain by a ground metal line 5, and an inter-level insulating structure 6 is provided on the ground metal line 5. The inter-level insulating structure 6 isolates the lower wirings 4 extending in one direction from the upper wirings 2 extending in a perpendicular direction to the one direction. A through-hole 6a is formed in the inter-level insulating structure 6, and a plug 7 connects the upper wiring 2 to one of the lower wirings 3. The shield layer 1 extends between the upper wirings 2 and the lower wirings 3, and is partially cut away so as to allow the plug 7 to pass.

The prior art shield layer 1 is effective against the cross-talk noise between the upper wirings 2 and the lower wirings 3. The lower wirings 3 usually propagates different signals. If the lower wirings 3 are arranged at wide intervals, the electrostatic influence between the adjacent wirings 3 would be ignoreable. However, if the distance between the adjacent wirings 3 is decreased, the signal on one of the lower wirings 3 electrostatically affects the adjacent lower wirings 3, and induces a cross-talk noise. Therefore, the prior art shield layer 1 can not prevent the wiring 3 from the adjacent wirings 3 on the same level.

Another shield structure is disclosed in Japanese Patent Publication of Unexamined Application No. 2-82531, and FIG. 2 illustrates the shield structure disclosed in the Japanese Patent Publication of Unexamined Application. An inter-level insulating structure 11 is fabricated on a semiconductor substrate 12, and aluminum wirings 13a, 13b and 13c extends in parallel to one another. The aluminum wiring 13b propagates a signal with a small amplitude, and a malfunction is liable to take place in a circuitry (not shown) coupled to the aluminum wiring 13b due to a cross-talk noise electrostatically induced by signals on the adjacent aluminum wirings 13a and 13c and upper and lower wirings (not shown). For this reason, a shield structure 14 is provided for the aluminum wiring 13b, and an upper inter-level shield layer 14a, a lower inter-level shield layer 14b and inter-line shield layers 14c and 14d form in combination the shield structure 14. The upper and lower inter-level shield layers 14a and 14b prevents the aluminum wiring 13b from the electrostatic influences of the signals on the upper and lower wirings, and the inter-line shield layers 14c and 14d block the aluminum wiring 13b from the electrostatic influences of the signals on the aluminum wirings 13a and 13c.

The shield structure 14 is effective against the electrostatic influences of not only the upper and lower wirings but also the adjacent wirings 13a and 13c on the same level. However, the shield structure 14 is constituted by the upper inter-level shield layers 14a, the lower inter-level shield layers 14b and the inter-line shield layers 14c/14d individually patterned, and the designer takes these inter-level/inter-line shield layers 14a to 14d into account in the design work on the wiring arrangement.

The three-dimensional wiring arrangement is usually very complex, and consumes a large amount of time and labor. The shield layers 14a to 14d further complicates the design work on the three-dimensional wiring arrangement, and the design work is getting more difficult. Thus, the prior art shield structure 14 encounters a first problem in the complex design work.

The second problem inherent in the prior art shield structure 14 is a signal delay on the shielded wiring layer. Although the inter-line shield layers 14c and 14d effectively block the wiring layer 13b from the electrostatic influences of the signals on the adjacent wirings 13a and 13c, the inter-line shield layers 14a and 14d are confronted with the side surfaces of the wiring layer 14c through the dielectric substance of the inter-level insulating structure 11, and parasitic capacitors are formed between the wiring layer 13b and the shield layers 14c and 14d. The parasitic capacitors introduce time delay into the propagation of the signal along the wiring layer 13b.

SUMMARY OF THE INVENTION

It is therefore an important object of the present invention to provide a semiconductor integrated circuit device a shield structure of which prevents signal wirings from the electrostatic influences of signals through a simple design work.

To accomplish the object, the present invention proposes to form a wiring in a groove defined by a composite sub-structures in which conductive shield lines respectively extend.

In accordance with one aspect of the present invention, there is provided a semiconductor integrated circuit device comprising: at least one circuit component forming a part of an integrated circuit; a wiring arrangement connected to the integrated circuit, and having at least two wiring strips; an inter-level insulating structure providing an electrical insulation among the integrated circuit and the wiring arrangement, and including a plane provided for the at least two wiring strips; and a shield structure including at least three composite sub-structures each having at least one conductive layer, at least one insulating layer laminated on the at least one conductive layer and insulating side walls covering side surfaces of the at least one conductive layer, the at least three composite sub-structures being arranged on the plane at intervals so as to form two grooves, the at least two wiring strips extending in the two grooves, respectively, so as to be self-aligned with the shield structure.

In accordance with another aspect of the present invention, there is provided a process of fabricating a semiconductor integrated circuit device, comprising the steps of: forming a lower insulating layer over a semiconductor substrate; laminating a composite structure including at least one conductive layer and at least one insulating layer on the lower insulating layer; patterning the composite structure into a plurality of composite sub-structures arranged at intervals and having respective conductive sub-layers and respective insulating sub-layers, adjacent two composite sub-structures of the plurality of composite sub-structures and an upper surface of the lower insulating layer defining a primary groove; forming side walls covering side surfaces of the plurality of composite sub-structures so that the side walls on the side surfaces of the adjacent two composite sub-structures defining a secondary groove in the primary groove, the side walls and the adjacent two composite sub-structures forming in combination a shield structure; and forming at least one wiring in the secondary groove in a self-aligned manner with the shield structure so as to be shielded by the conductive sub-layers of the adjacent two composite sub-structures.

BRIEF DESCRIPTION OF THE DRAWINGS

The features and advantages of the semiconductor integrated circuit device according to the present invention will be more clearly understood from the following description taken in conjunction with the accompanying drawings in which.

DESCRIPTION OF THE PREFERRED EMBODIMENTS

First Embodiment

Figure 1:
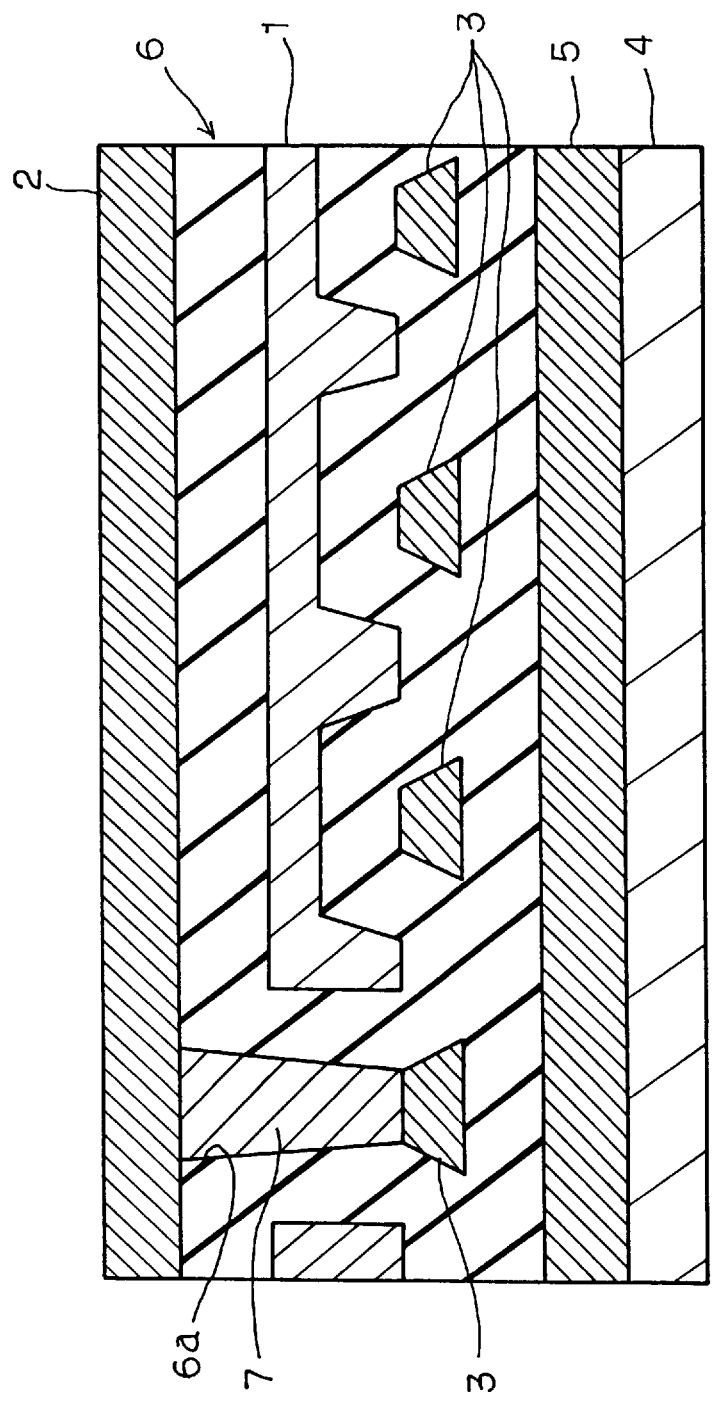
FIG. 1 is a cross sectional view showing the prior art shield layer provided for the multi-level wiring structure.
Figure 2:
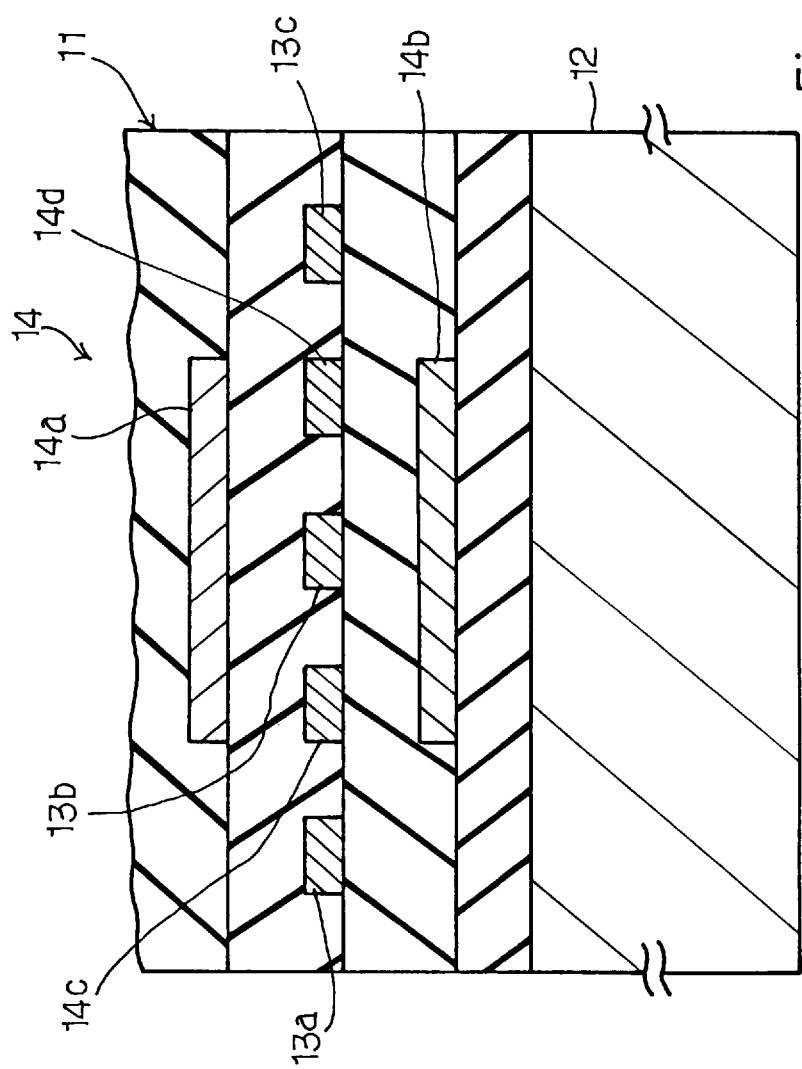
FIG. 2 is a cross sectional view showing the prior art shield structure provided for the multi-level wiring structure.
Figure 3A:
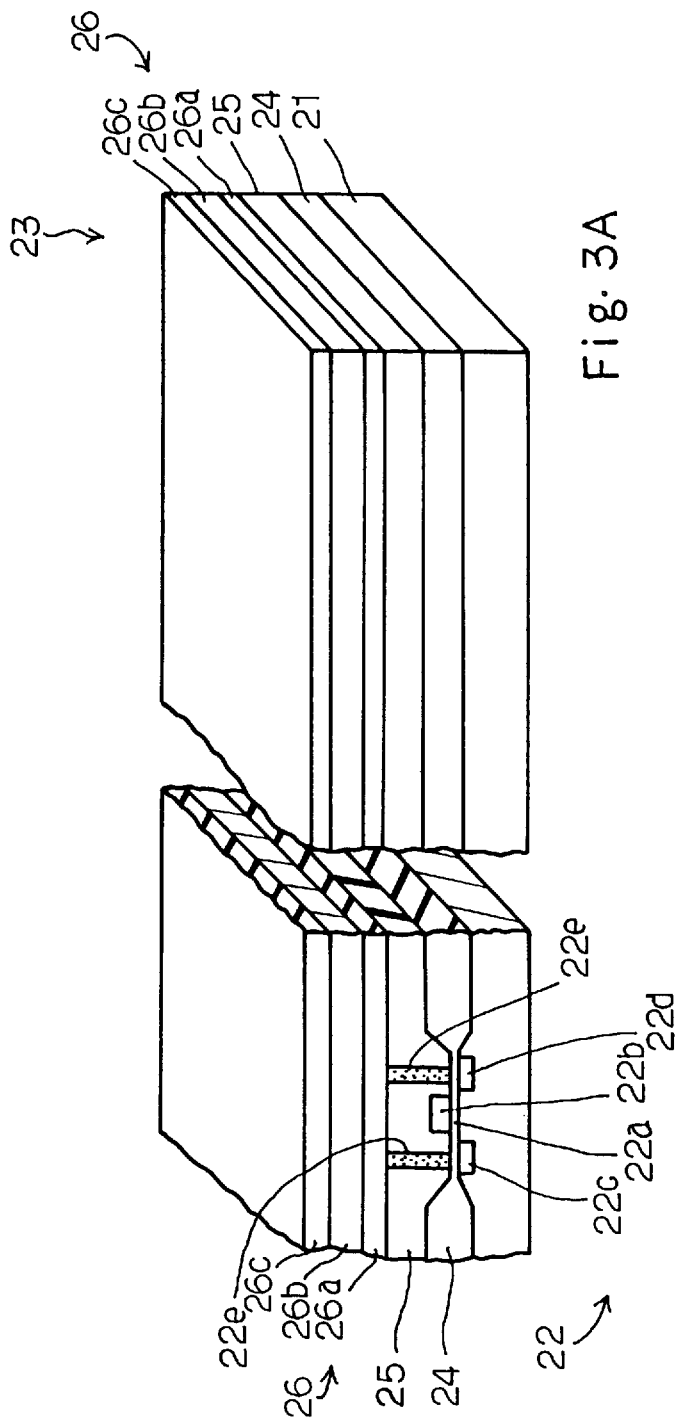
FIGS. 3A to 3C are perspective views showing a process sequence for fabricating a semiconductor integrated circuit device according to the present invention.
Figure 3B:
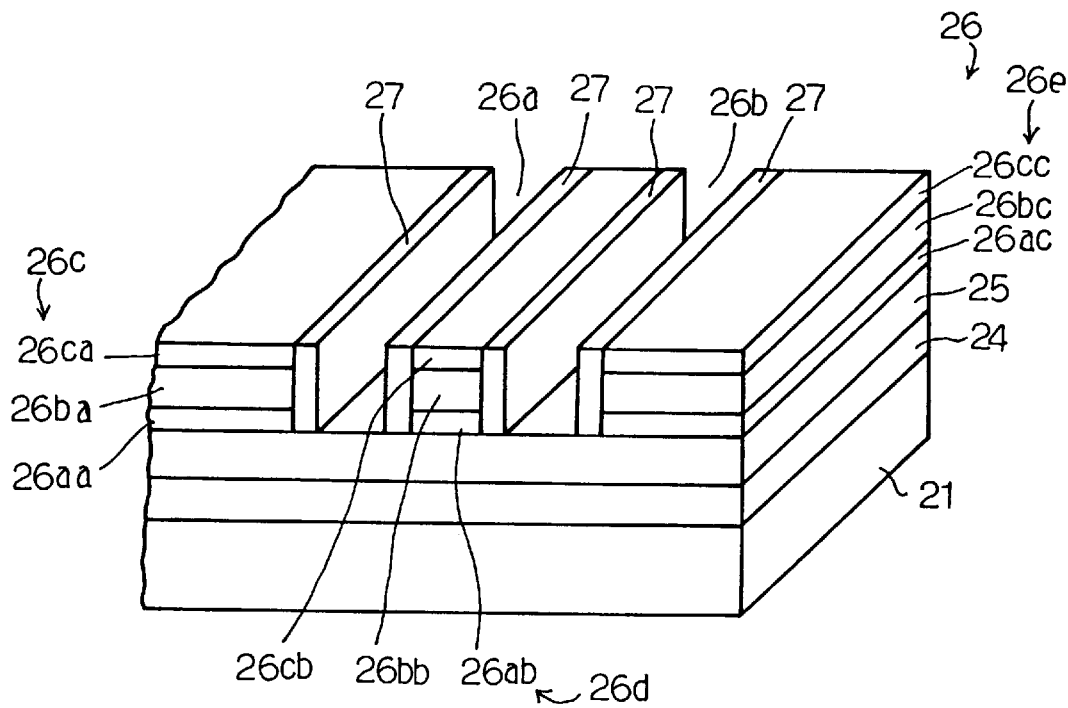
Figure 3C:
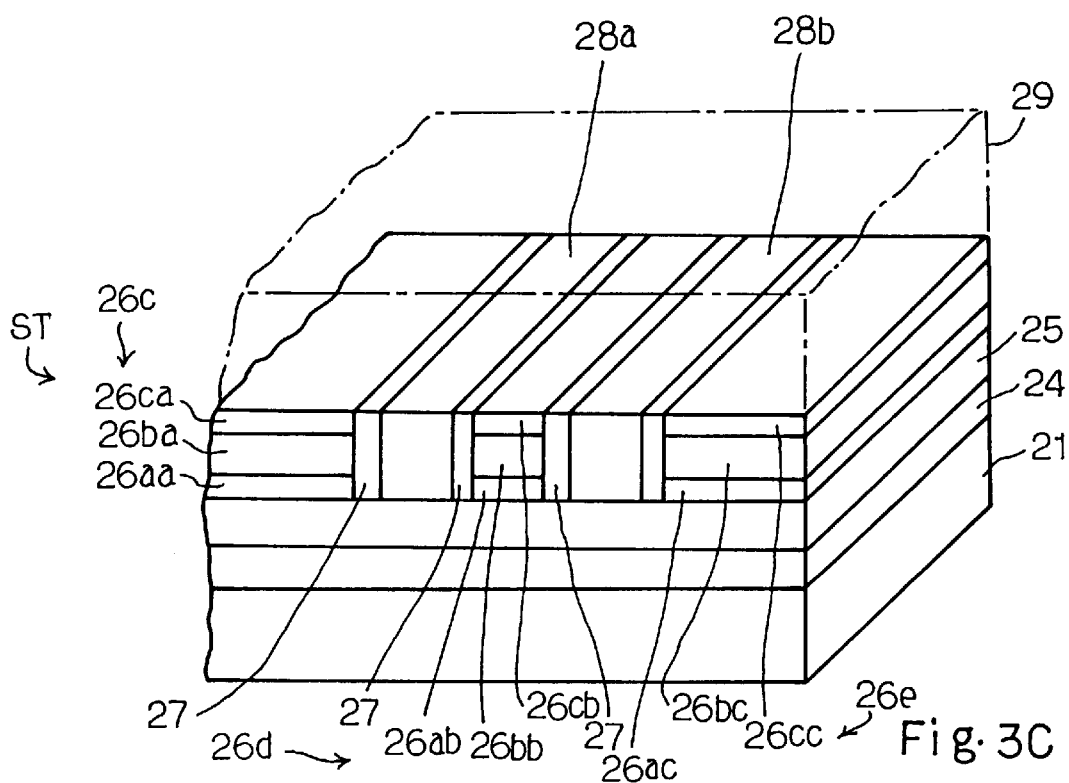

FIGS. 3A to 3C illustrate a process sequence for fabricating a semiconductor integrated circuit device embodying the present invention. Although FIG. 3A shows two areas on a semiconductor substrate 21 assigned to a field effect transistor 22 and a wiring arrangement 23, a large number of circuit components are fabricated on the same semiconductor substrate 21. The circuit components are less important for understanding the present invention, and the area assigned to the field effect transistor 22 is deleted from FIGS. 3B and 3C for the sake of simplicity.

The process starts with preparation of the semiconductor substrate 21, and a thick field oxide layer 24 is selectively grown on a major surface of the semiconductor substrate 21. The thick field oxide layer 24 defines a plurality of active regions, and the field effect transistor 22 is assigned to one of the active areas.

Subsequently, the field effect transistor 22 is fabricated on the semiconductor substrate 21 together with other field effect transistors as follows. However, description is focused on the field effect transistor 22 only. A thin gate oxide 22a is thermally grown on the active region, and a doped polysilicon is deposited over the entire surface of the structure. The thin gate oxide layer 22a is overlain by the doped polysilicon layer. The doped polysilicon layer is coated with a photo-resist layer, and the photo-resist layer is patterned into a photo-resist mask by using lithographic techniques. Using the photo-resist mask, the doped polysilicon layer is patterned into a gate electrode 22b. Dopant impurity is ion implanted into the active region, and source and drain regions 22c and 22d are formed in the active region in a self-aligned manner with the gate electrode 22b. The thin gate oxide layer 22a, the gate electrode 22b and the source and drain regions 22c/22d as a whole constitute the field effect transistor 22, and the field effect transistor 22 and other circuit components will be connected to the wiring arrangement 23 for forming an integrated circuit in later stages of the process sequence. In the following description, the field effect transistor 22 represents the circuit components of the integrated circuit.

Boro-phospho-silicate glass is deposited to 1–2 microns thick by using a plasma-assisted chemical vapor deposition, and the boro-phospho-silicate glass layer 25 covers the field effect transistor 22. Silicon dioxide is available instead of the boro-phospho-silicate glass. The boro-phospho-silicate glass layer 25 topographically extends over the field effect transistor 22, and the gate electrode 22 waves the surface of the boro-phospho-silicate glass layer 25.

The boro-phospho-silicate glass layer 25 is polished by using polishing slurry containing colloidal silica particles. In detail, the boro-phospho-silicate glass layer 25 is pressed against a polishing pad (not shown) at 0.4 kilogram/cm$^2$, and the polishing pad is rotated at 35 rpm. The polishing slurry is supplied onto the polishing pad at 50 to 200 milli-litter/minute. The waved surface portion is removed, and a flat surface is created on the boro-phospho-silicate glass layer 25. After the polishing, the flat surface is scrubbed by using a brush, and, thereafter, is etched in dilute hydrofluoric acid solution by 100 to 200 angstroms thick. The residual colloidal silica particles are perfectly removed from the flat surface.

Subsequently, a composite film structure 26 is formed contact holes which reach the source/drain regions 22c/22d and the gate electrode 22b. In this instance, the contact holes are 0.3 micron square, and are plugged with tungsten pieces 22e as follows. First, a composite barrier layer (not shown) is deposited over the entire surface of the structure by using a collimate sputtering technique, and the composite barrier layer is implemented by a titanium film of 500 angstroms thick and a titanium nitride film of 1000 angstroms thick. Subsequently, tungsten is grown to 3000 angstroms thick over the composite barrier layer by using a blanket chemical vapor deposition technique. The chemical mechanical polishing is carried out, and removes the barrier layer and the tungsten layer on the upper surface from the boro-phospho-silicate glass layer. Then, the barrier layers and the tungsten plugs 22e are left in the contact holes. Polishing slurry contains silica particles ranging between 0.01 micron to 0.05 micron in diameter, and amine and hydrogen peroxide are mixed into pure water together with the silica particles. The polishing is carried out under the pressure of 0.2 kg/cm$^2$ to 0.4 kg/cm$^2$.

Subsequently, a composite film structure 26 is formed on the flat surface of the boro-phospho-silicate glass layer 25. In detail, silicon oxide is deposited to 2000 angstroms thick over the flat surface by using a chemical vapor deposition, and the boro-phospho-silicate glass layer 25 is overlain by a first insulating layer 26a of silicon dioxide. Boro-phospho-silicate glass or fluorine-containing silica is available for the first insulating layer 26a, and the thickness is not limited to 2000 angstroms.

A conductive layer 26b is deposited over the first insulating layer 26a, and metal such as aluminum, tungsten or titanium, a conductive ceramic such as ruthenium oxide or titanium nitride, doped polysilicon, a refractory metal silicide such as tungsten silicide or a combination thereof is available for the conductive layer 26b.

The thickness of the conductive layer 26b is dependent on the substance, i.e. the resistivity of the conductive layer 26b. In this instance, a tungsten film sandwiched between titanium nitride films forms the conductive layer 26b. The titanium nitride films are 500 angstroms thick, and the tungsten film is 2000 angstroms thick.

A second insulating layer 26c of silicon oxide is deposited to 3000 angstroms thick over the conductive layer 26b, and the boro-phospho-silicate glass or the fluorine-containing silica is also available for the second insulating layer 26c. The first insulating layer 26a, the conductive layer 26b and the second insulating layer 26c as a whole constitute the composite film structure 26, and the resultant structure is illustrated in FIG. 3A.

In this instance, the three-level structure is used as the composite film structure 26. However, only the conductive layer 26b and the second insulating layer 26c may form in combination the composite film structure 26.

Photo-resist is spread over the upper surface of the composite film structure 26, and the photo-resist layer (not shown) is patterned into a photo-resist mask exposing the upper surface of the second insulating layer 26c at intervals. The composite film structure 26 is partially removed by using a dry etching technique, and grooves 26a and 26b are formed in the composite film structure 26. In this instance, the grooves 26a and 26b are 0.8 micron in width, and are repeated at 1.2 microns pitch. However, there is not limit on the width of the grooves 26a and 26b and the pitch therebetween.

The groove 26a and 26b divide the composite film structure into composite film sub-structures 26c, 26d and 26e. A conductive strip 26ba, 26bb or 26bc and first and second insulating sub-layers 26aa/26ca, 26ab/26cb or 26ac/26cc form in combination each of the composite film sub-structures 26c to 26e.

An insulating substance is deposited over the entire surface of the composite film sub-structures 26c to 26e and the exposed surface of the boro-phospho-silicate glass layer 25 by using a chemical vapor deposition. It is desirable for the insulating substance to have a small dielectric constant, because the insulating substance with a small dielectric constant decreases the capacitance of a parasitic capacitor between the conductive stripe 26ba/26bb/26bc and adjacent wiring strips to be formed in the grooves 26a and 26b in the next stage. Silicon oxide, fluorine-containing silica and parylene are 3.8–4.0, 3.3 and 2.5 in dielectric constant, respectively, and are available for the insulating layer in this stage. The parylene is disclosed by Majid et. al. in "The Parylene-Aluminum Multilayer Interconnection System for Wafer Scale Integration and Wafer Scale Hybrid Package", Journal of Electronic Materials, vol. 18, No. 2, pages 301 to 311, 1989.

The insulating layer deposited in the previous stage is anisotropically etched without a mask, and side walls 27 are left on the side surfaces of the composite film sub-structures 26c to 26e. In this instance, the side walls are 0.1 micron in thickness. Each of the conductive strips 26ba, 26bb and 26bc is wrapped in the first and second insulating sub-layers 26aa/26ca, 26ab/26cb or 26ac/26cc and the side walls 27 as shown in FIG. 3B. The composite sub-structures 6c to 6e and the side walls 27 form in combination a shield structure ST.

Subsequently, titanium layer (not shown) is grown to 500 angstroms thick by using a sputtering, and the resultant structure is conveyed to a high temperature reflow sputtering system. The titanium layer increases the adhesion to an aluminum layer deposited in the next step, and a composite layer of a titanium film and a titanium nitride film may be used instead of the single titanium layer.

Subsequently, aluminum is deposited over the entire surface of the resultant structure shown in FIG. 3B by using the high temperature reflow sputtering technique. The thickness of the aluminum layer is dependent on the depth and width of the grooves 26a and 26b. If the grooves 26a and 26b are 0.8 micron in depth and 0.4 micron in width, the aluminum is sputtered to 0.4 to 1.2 micron thick.

The titanium layer and the aluminum layer are polished by using polishing slurry. The polishing slurry is prepared by dispersing colloidal silica particles and oxidizing agent such as hydrogen peroxide in weak alkaline solution. The titanium layer and the aluminum layer on the composite substructures 26c to 26e are removed through the polishing, and aluminum wirings 28a and 28b are left in the grooves 26a and 26b, respectively, as shown in FIG. 3C. The polishing defines the aluminum wirings 28a and 28b in a self-aligned manner with the shield structure ST, and the self-alignment between the shield structure ST and the aluminum wirings 28a/28b simplifies the design work on the wiring arrangement.

In this instance, the wirings 28a and 28b are formed of aluminum. However, other conductive materials such as, for example, copper, tungsten and tungsten silicide are available for the wirings 28a and 28b. Moreover, the conductive material may be deposited by using a chemical vapor deposition.

Subsequently, the shield structure ST and the aluminum wirings 28a and 28b are covered with an inter-level insulating structure 29.

The conductive strips 26ba, 26bb and 26bc are wrapped in the insulating substance, i.e., the lower and upper insulating sub-layers 26aa/26ca, 26ab/26cb and 26ac/26cc and the side walls 27, and are electrically isolated from the aluminum wirings 28a and 28b. The conductive strips 26ba, 26bb and 26bc serve as shield lines, and the shield structure ST prevents the aluminum wirings 28a and 28b from the electrostatic influences of signals on adjacent aluminum wirings.

The conductive strips 26ba, 26bb and 26bc are thinner than the aluminum wirings 28a and 28b, and, accordingly, the narrow side surface of the conductive strip 26ba/26bb/26bc is confronted with the aluminum wiring 28a or 28b. As a result, the parasitic capacitance between the conductive strip 26ba/26bb/26bc and the aluminum wiring 28a/28b is decreased. However, if the conductive strips 26ba/26bb/26bc are too thin, the cross-talk takes place between the adjacent aluminum wirings such as 28a and 28b. In fact, the appropriate thickness of the conductive strips 26ba to 26bc is dependent on the thickness of the wide walls 27. If the side walls 27 are thick, the distance between the adjacent aluminum wirings 28a and 28b is increased, and thin conductive strips 26ba to 26bc are not causative of the cross-talk. The thick side walls 27 decreases the parasitic capacitance. However, the thick side walls 27 decrease the width of the grooves 26a and 26b and, accordingly, the width of the aluminum wirings 28a and 28b, and increase the resistance of the aluminum wirings 28a and 28b.

The shield structure ST extends over the remaining area not assigned to the wiring arrangement, and the conductive strips 26ba to 26bc respectively form large parasitic capacitors together with the semiconductor substrate 21. For this reason, even if the conductive strips 26ba to 26bc are not connected to a constant voltage source such as the ground level, the shield structure ST effectively blocks the aluminum wirings 28a and 28b from the electrostatic influences of signals passing through the adjacent aluminum wirings. Thus, the shield structure ST embodying the present invention does not require an additional area for the connection to the constant voltage source and any additional electrical connection. Accordingly, the process sequence does not require additional steps for connecting the shield structure to the constant voltage source.

As will be understood from the foregoing description, the process sequence self-aligns the aluminum wirings 28a and 28b with the shield structure ST, and the design work on the wiring arrangement is simplified.

The aluminum wirings 28a and 28b self-aligned with the shield structure ST is spaced from the shield lines, i.e., the conductive strips 26ba to 26bc by the side walls 27, and the side walls 27 minimizes the vacant area between the aluminum wirings 8a/28b and the shield structure ST. This results in a high dense wiring arrangement.

Moreover, the shield structure extends over the remaining area over the circuit components of the integrated circuit and the field oxide layer 24 not assigned to the wiring arrangement, and the large parasitic capacitance allows the shield lines to effectively block the aluminum wirings 28a/28b from the electrostatic influences without an electrical connection to a constant voltage source.

Finally, the conductive strips 26ba to 26bc are thinner than the aluminum wirings 28a and 28b, and decrease the parasitic capacitance therebetween.

Second Embodiment

Figure 4:
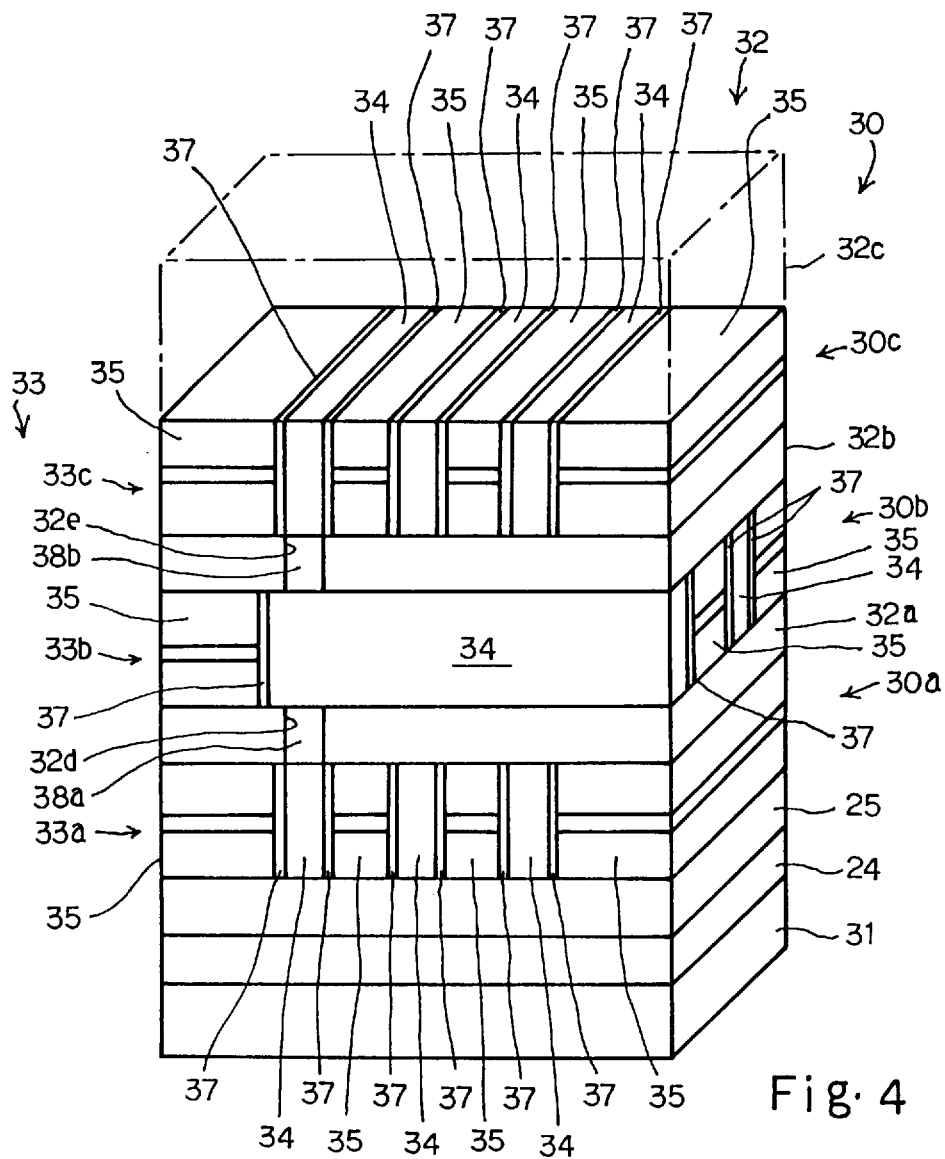
FIG. 4 is a perspective view showing another semiconductor integrated circuit device according to the present invention.

Turning to FIG. 4 of the drawings, a three-dimensional wiring structure 30 is fabricated over a semiconductor substrate 31. The field oxide layer 24 and the boro-phospho-silicate glass layer 25 are laminated on the semiconductor substrate 31 as similar to the first embodiment. Although circuit components of an integrated circuit are fabricated on another area of the semiconductor substrate 31, they are deleted from FIG. 4 for the sake of simplicity. The integrated circuit is electrically connected to the three-dimensional wiring structure 30, and the three-dimensional wiring arrangement includes first-level, second-level and third-level wiring arrangements 30a, 30b and 30c.

The semiconductor integrated circuit device implementing the second embodiment further comprises an inter-level insulating structure 32, and the inter-level insulating structure 32 includes the boro-phospho-silicate glass layer 25 and first-level, second-level and third-level insulating layers 32a, 32b and 32c. The first-level, second-level and third-level wiring arrangements 30a to 30c are alternately laminated with the first-level, second-level and third-level insulating layers 32a, 32b and 32c.

In order to prevent the first-level to third-level wiring arrangements 30a to 30c from a mutual cross-talk, the first-level and second-level insulating layers 32a and 32b are formed as thick as possible. In this instance, the first-level and the second-level insulating layers 32a and 32b are 1 to 2 microns in thickness.

The three-dimensional wiring structure 30 is associated with a shield structure 33, and the shield structure 33 includes first-level, second-level and third-level shield sub-structures 33a, 33b and 33c. The first-level, second-level and third-level shield sub-structures 33a to 33c are provided on the same plane as the first-level, second-level and third-level wiring arrangements 30a to 30c, and prevent the first-level, second-level and third-level wiring arrangements 30a to 30c from mutual electrical influences of signals passing therethrough.

A plurality of signal wirings 34 are incorporated in each of the first-level to third-level wiring arrangements 30a to 30c, and a plurality of composite sub-structures 35 and side walls 73 form in combination each of the first-level to third-level shield sub-structures 33a to 33c. The composite sub-structure 35 is similar in structure to the composite sub-structure 26c/26d/26e, and the side walls 37 are corresponding to the side walls 27. For this reason, no further description on the composite sub-structures 35 and the side walls 37 is hereinbelow incorporated for avoiding repetition.

The first-level wiring arrangement 30a and the first-level shield sub-structure 33a are fabricated on the boro-phospho-silicate glass layer 25 as similar to the first embodiment, and are overlain by the first-level insulating layer 32a.

After the first-level insulating layer 32a is formed on the first-level wiring arrangement 30a, a through-hole 32d is formed in the first-level insulating layer 32a. A part of one of the signal wirings 34 is exposed to the through-hole 32d. Titanium nitride is deposited to 500 angstroms thick over the first-level insulating layer 32a by using a collimate sputtering technique, and the titanium nitride layer (not shown) is overlain by tungsten deposited by using a chemical vapor deposition. Then, the tungsten layer is etched back through a dry etching using $SF_6$ gas, and a piece of tungsten 38a is left in the through-hole 32d. The piece of tungsten 38a plugs the through-hole 32d, and is held in contact with one of the signal wirings 34.

The second-level wiring arrangement 30b and the second-level shield sub-structure 33b are fabricated on the first-level insulating layer 32a through the process sequence similar to that of the first embodiment, and one of the signal wirings 34 of the second-level wiring arrangement 30b is held in contact with the upper surface of the piece of tungsten 38a. Thus, the piece of tungsten 38a electrically connects the first-level wiring arrangement 30a to the second-level wiring arrangement 30b.

The second-level insulating layer 32b is deposited over the second-level wiring arrangement 30b and the second-level shield sub-structure 33b, and a through-hole 32e is formed in the second-level insulating layer 32b. The through-hole 32e is plugged by a piece of tungsten 38b as similar to the through-hole 32d, and the third-level wiring arrangement 30c and the shield sub-structure 33c are fabricated on the second-level insulating layer 32b through the process sequence similar to the first embodiment. The piece of tungsten 38b electrically connects the second-level wiring arrangement 30b to the third-level wiring arrangement 30c. Finally, the third-level insulating layer 32c is deposited over the second-level wiring arrangement 30c and the third-level shield sub-structure 33c.

The second embodiment achieves all of the advantages of the first embodiment.

Third Embodiment

Figure 5A:
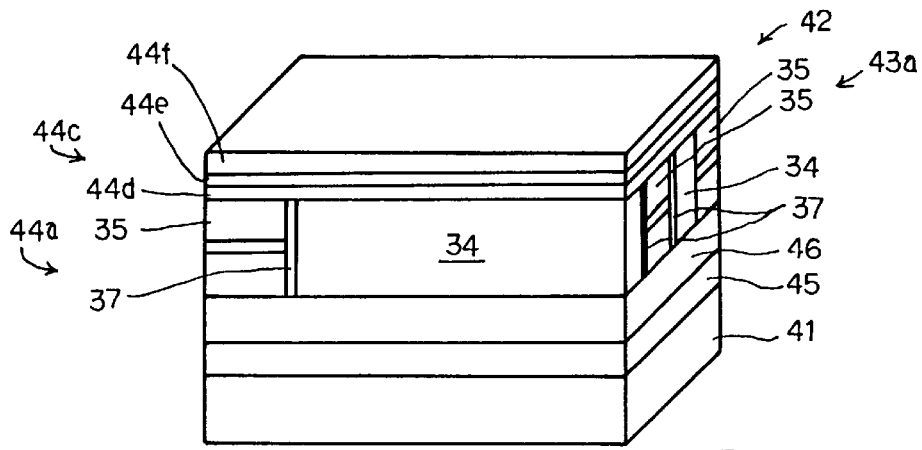
FIGS. 5A to 5C are perspective views showing another process sequence for fabricating yet another semiconductor integrated circuit device according to the present invention.
Figure 5B:
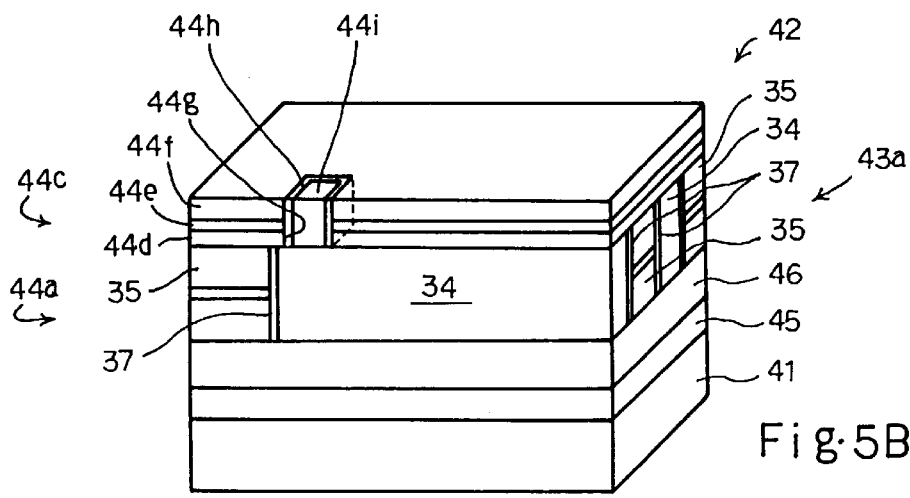
Figure 5C:
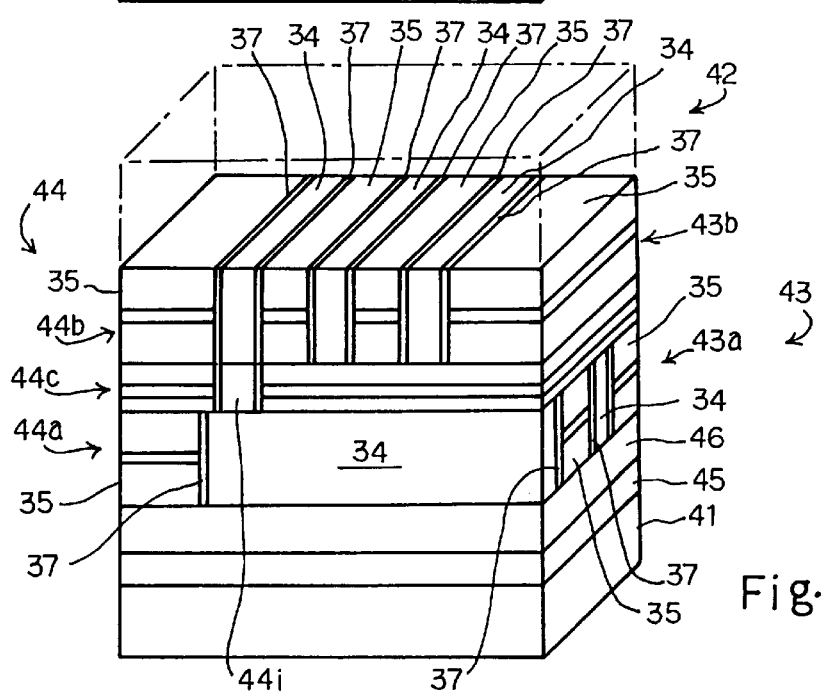

FIGS. 5A to 5C illustrate another process sequence for fabricating a semiconductor integrated circuit device according to the present invention. The semiconductor integrated circuit device implementing the third embodiment is fabricated on a semiconductor substrate 41, and comprises an integrated circuit (not shown), an inter-level insulating structure 42, a three-dimensional wiring structure 43 and a shield structure 44. A thick field oxide layer 45 and a boro-phospho-silicate glass layer 46 are laminated on the semiconductor substrate 41 as similar to the first embodiment.

The three-dimensional wiring structure 43 includes a first-level wiring arrangement 43a similar to the second-level wiring arrangement 30b and a second-level wiring arrangement 43b similar to the third-level wiring arrangement 30c, and components of the first-level and second-level wiring arrangements 43a and 43b are labeled with the same references as those of the second-level and third-level wiring arrangements 30b and 30c without detailed description.

The shield structure includes a first-level shield structure 44 includes a first-level shield sub-structure 44a similar to the second-level shield sub-structure 33b, a second-level shield sub-structure 44b similar to the third-level shield sub-structure 33c and an inter-level shield sub-structure 44c, and the components of the first-level and second-level shield sub-structures 44a and 44b are labeled with the same references as those of the second-level and third-level shield sub-structures 33b and 33c without detailed description. The inter-level shield sub-structure 44c further forms a part of said inter-level insulating structure 42, and is effective against an inter-level cross talk between the first-level wiring arrangement 43a and the second-level wiring arrangement 43b.

Description is hereinbelow made on a process sequence for fabricating the semiconductor integrated circuit device. The process sequence is similar to the process sequence for the first embodiment until the first-level wiring arrangement 43a and the first-level shield sub-structure 44a are completed, and, for this reason, the description starts from the fabrication of the inter-level shield sub-structure 44c.

An insulating layer 44d, a conductive layer 44e and an insulating layer 44f are successively deposited over the first-level wiring arrangement 43a and the first-level shield sub-structure 44a. The insulating layers 44d and 44f are formed of boro-phospho-silicate glass, silicon dioxide or fluorine-containing silica, and are deposited by using a chemical vapor deposition. The conductive layer 44e is formed of metal such as, for example, tungsten, titanium or aluminum, conductive ceramic such as, for example, ruthenium oxide or titanium nitride or a composite film structure of these substances. There is no limit on the thickness of the insulating layers 44d and 44f and the thickness of the conductive layer 44e. If a composite film structure is used, a tungsten film of 1000 angstroms thick sandwiched between titanium nitride films of 500 angstroms thick is inserted between the insulating layers 44d and 44f of silicon dioxide of 7000 angstroms thick. The resultant structure of this stage is illustrated in FIG. 5A.

Subsequently, a through-hole 44g is formed in the inter-level shield sub-structure 44c by using the lithographic techniques and an etching process, and one of the signal wirings 34 of the first-level wiring arrangement 43a is exposed to the through-hole 44g.

Silicon dioxide is deposited over the inter-level shield sub-structure 44c, and the silicon dioxide layer (not shown) is etched by using an anisotropical dry etching. As a result, a side wall 44h is formed on the inner surface defining the through-hole 44g.

A titanium nitride layer (not shown) is deposited to 500 angstroms thick by using a collimate sputtering technique, and tungsten is grown on the titanium nitride layer by using a blanket tungsten CVD (Chemical Vapor Deposition). The thickness of the tungsten layer is at least a half of the distance between the opposite surface of the side wall 44h. For example, if the through-hole 44g is 0.4 micron square, the tungsten layer of 0.3 micron thick may be deposited. The tungsten layer fills the through-hole 44g, and extends over the insulating layer 44f.

The tungsten on the upper surface of the insulating layer 44f is removed by using a polishing, and a piece of tungsten 44i is left in the through-hole 44g. Polishing slurry is weak alkaline solution containing colloidal silica particles at 10 weight percent and oxidizing agent, and is around pH-8. The polishing slurry is supplied at 50 to 150 milli-litter/minute, and the tungsten layer is pressed against a polishing pad (not shown) at 0.4 kilogram/cm$^2$. The polishing pad is rotated at 35 rpm. After the polishing, the polished surface is subjected to a brush-scrub and cleaning in a dilute hydrofluoric acid solution.

The piece of tungsten 44i is held in contact with the first-level wiring arrangement 43a. The conductive layer 44e extends over the first-level wiring arrangement 43a and the first-level shield sub-structure 44a except for the through-hole 44g, and effectively blocks the first-level wiring arrangement 43a from the inter-level cross-talk. The resultant structure is illustrated in FIG. 5B.

Subsequently, the second-level wiring arrangement 43b and the second-level shield sub-structure 44b are fabricated on the inter-level shield sub-structure 44c as similar to the first-level wiring arrangement 43a and the first-level shield sub-structure 44a. The piece of tungsten 44i electrically connects the first-level wiring arrangement 43a to the second-level wiring arrangement 43b.

Finally, the inter-level insulating structure 43 is completed.

The first-level and second-level shield sub-structures 44a and 44b respectively prevent the first-level wiring arrangement 43a and the second-level wiring arrangement 43b from a cross-talk, and the inter-level shield structure 44c blocks the first-level and second-level wiring arrangements 43a and 43b from the electrostatic influences of the signals on the different-level.

If the conductive layer 44e is connected to a radiator plate, the heat generated by the integrated circuit is effectively radiated, and the conductive layer 44e enhances the heat radiation capability.

The advantages of the third embodiment are analogous from the first embodiment, and no further description is incorporated hereinbelow.

Although particular embodiments of the present invention have been shown and described, it will be obvious to those skilled in the art that various changes and modifications may be made without departing from the spirit and scope of the present invention.

What is claimed is:

1. A process of fabricating a semiconductor integrated circuit device, comprising the steps of:
   a) forming a lower insulating layer over a semiconductor substrate;
   b) laminating a composite structure including at least one conductive layer and at least one insulating layer on said lower insulating layer;
   c) patterning in a single patterning step for forming said composite structure into a plurality of composite sub-structures arranged at intervals and having respective conductive sub-layers and respective insulating sublayers by using a lithographic technique and an etching technique, adjacent two composite sub-structures of said plurality of composite sub-structures and an upper surface of said lower insulating layer defining a primary groove so that a plurality of primary grooves are formed between said plurality of composite sub-structures;

d) forming side walls covering side surfaces of said plurality of composite sub-structures so that the side walls on the side surfaces of said adjacent two composite sub-structures defining a secondary groove in said primary groove, a plurality of secondary grooves being formed in said plurality of primary grooves, respectively, said side walls and said adjacent two composite sub-structures forming in combination a shield structure so that said plurality of secondary grooves space a plurality of shield structures from one another; and e) growing conductive material in said secondary grooves so as to form wirings in said secondary grooves without a lithographic technique and an etching technique and in a self-aligned manner with said plurality of shield structures so that said side walls on said side surfaces of the adjacent two composite sub-structures electrically isolate each of said wirings from the conductive sub-layers of said adjacent two composite sub-structures.

2. The process as set forth in cliam 1, in which said step e) inclues the sub-steps of e-1) depositing a conductive material over the entire surface of the resultant structure of said step d) so as to cover an upper surface of said shield structure and surfaces defining said secondary groove with a conductive material layer, e-2) removing said conductive material of said conductive material layer on said upper surface of said shield structure so that said at least one wiring of said conductive material remains in said secondary groove.

3. The process as set forth in claim 2, in which said sub-step e-2) is achieved by using a polishing.

4. The process as set forth in claim 1, further comprising the steps of:

f) forming an inter-level shield structure over said at least one wiring and said shield structure; and g) laminating another composite structure including at least one conductive layer and at least one insulating layer on said inter-level shield structure;

h) patterning said another composite structure into a plurality of other composite sub-structures arranged at intervals and having respective conductive sub-layers and respective insulating sub-layers, adjacent two composite sub-structures of said plurality of other composite sub-structures and an upper surface of said inter-level shield structure defining another primary groove;

i) forming other side walls covering side surfaces of said plurality of other composite sub-structures so that the side walls on the side surfaces of said adjacent two composite sub-structures of said plurality of other composite sub-structures defining another secondary groove in said another primary groove, said other side walls and said adjacent two composite sub-structures of said plurality of other composite sub-structures forming in combination another shield structure; and j) forming at least another one wiring in said another secondary groove in a self-aligned manner with said another shield structure so as to be shielded by the conductive sub-layers of said adjacent two composite sub-structures of said plurality of other composite sub-structures.

5. The process as set forth in claim 4, in which said step f) includes the sub-steps of f-1) successively depositing a lower insulating layer, an inter-level conductive layer and an upper insulating layer over said shield structure and said at least one wiring, f-2) forming a through-hole passing through said lower insulating layer, said inter-level conductive layer and said upper insulating layer, f-3) forming an insulating side wall on an inner surface defining said through-hole, and f-4) filling said through hole with a conductive piece held in contact with said at least one wiring, said conductive piece being further held in contact with said at lest one another wiring in said step j).

* * * * *